United States Patent [19]

DeKoning et al.

[11] Patent Number: 5,761,705
[45] Date of Patent: Jun. 2, 1998

[54] METHODS AND STRUCTURE FOR MAINTAINING CACHE CONSISTENCY IN A RAID CONTROLLER HAVING REDUNDANT CACHES

[75] Inventors: Rodney A. DeKoning; Donald R. Humlicek; Max L. Johnson, all of Wichita, Kans.

[73] Assignee: Symbios, Inc., Fort Collins, Colo.

[21] Appl. No.: 630,906

[22] Filed: Apr. 4, 1996

[51] Int. Cl.[6] ............................ G06F 12/08; G06F 13/16; G06F 11/14
[52] U.S. Cl. ............................ 711/113; 711/114; 711/142; 711/143; 711/162; 395/182.04; 395/182.05
[58] Field of Search ....................... 395/465, 470, 395/489, 441, 182.04, 182.05, 440

[56] References Cited

U.S. PATENT DOCUMENTS

| | | | |
|---|---|---|---|
| 4,837,675 | 6/1989 | Bean et al. | 395/182.03 |
| 4,862,411 | 8/1989 | Dishon et al. | 711/167 |
| 5,140,592 | 8/1992 | Idleman et al. | 395/182.03 |
| 5,155,840 | 10/1992 | Beal et al. | 395/551 |
| 5,276,864 | 1/1994 | Hernandez et al. | 395/182.08 |
| 5,367,669 | 11/1994 | Holland et al. | 395/182.05 |
| 5,390,186 | 2/1995 | Murata et al. | 711/113 |
| 5,437,022 | 7/1995 | Beardsley et al. | 395/182.04 |

FOREIGN PATENT DOCUMENTS

| | | |
|---|---|---|
| 0496506 | 7/1992 | European Pat. Off. . |
| 0573307 | 12/1993 | European Pat. Off. . |

OTHER PUBLICATIONS

David A. Patterson, Garth Gibson and Randy H. Katz; A Case for Redundant Arrays of Inexpensive Disks(RAID); Dec. 1987; Report No. UCB/CSD 87/391.

*Primary Examiner*—Eddie P. Chan
*Assistant Examiner*—Reginald G. Bragdon
*Attorney, Agent, or Firm*—Daniel L. Fishman; Wayne P. Bailey

[57] ABSTRACT

Methods and associated apparatus operable in a RAID subsystem having redundant disk array controllers to assure dual, redundant cache consistency while permitting operation of the RAID subsystem in response to host computer I/O requests. The methods and apparatus of the present invention provide for a process of initializing the redundant disk array controllers in response to a power-on reset cycle (or other similar reset cycles). The first controller partially initializes for processing of host requests then awaits the partial initialization of the second controller. After a brief timeout awaiting the second controller, or in response to an erroneous initialization of the second controller, the first controller configures itself to perform host computer I/O requests in a write-through mode (bypassing cache operations) until the second controller eventually initializes. Once both controller are initialized, the redundant caches are synchronized. Finally, the initialized controllers having synchronized the redundant caches begin normal, mirrored, redundant operation. Until such time as the redundant caches are synchronized, the first controller continues operations in response to host computer I/O requests but with the degraded performance associated with the cache write-through mode.

16 Claims, 6 Drawing Sheets

DUAL - ACTIVE RDAC PAIR

FIG. 3

ACTIVE / PASSIVE RDAC PAIR

FIG. 6 ns and Structure for Maintaining Cache Consistency in a RAID Controller Having Redundant Caches

BACKGROUND OF THE INVENTION

1. Field of the Invention

The invention relates generally to the control methods operable within a disk array subsystem (RAID) and in particular to a method for maintaining cache mirroring consistency between redundant caches through reset cycles of the caches.

2. Background of the Invention

Modern mass storage subsystems are continuing to provide increasing storage capacities to fulfill user demands from host computer system applications. Due to this critical reliance on large capacity mass storage, demands for enhanced reliability are also high. Various storage device configurations and geometries are commonly applied to meet the demands for higher storage capacity while maintaining or enhancing reliability of the mass storage subsystems.

A popular solution to these mass storage demands for increased capacity and reliability is the use of multiple smaller storage modules configured in geometries that permit redundancy of stored data to assure data integrity in case of various failures. In many such redundant subsystems, recovery from many common failures can be automated within the storage subsystem itself due to the use of data redundancy, error codes, and so-called "hot spares" (extra storage modules which may be activated to replace a failed, previously active storage module). These subsystems are typically referred to as redundant arrays of inexpensive (or independent) disks (or more commonly by the acronym RAID). The 1987 publication by David A. Patterson, et al., from University of California at Berkeley entitled *A Case for Redundant Arrays of Inexpensive Disks (RAID)*, reviews the fundamental concepts of RAID technology.

There are five "levels" of standard geometries defined in the Patterson publication. The simplest array, a RAID level 1 system, comprises one or more disks for storing data and an equal number of additional "mirror" disks for storing copies of the information written to the data disks. The remaining RAID levels, identified as RAID level 2,3,4 and 5 systems, segment the data into portions for storage across several data disks. One of more additional disks are utilized to store error check or parity information.

RAID storage subsystems typically utilize a control module that shields the user or host system from the details of managing the redundant array. The controller makes the subsystem appear to the host computer as a single, highly reliable, high capacity disk drive. In fact, the RAID controller may distribute the host computer system supplied data across a plurality of the small independent drives with redundancy and error checking information so as to improve subsystem reliability. Frequently RAID subsystems provide large cache memory structures to further improve the performance of the RAID subsystem. The cache memory is associated with the control module such that the storage blocks on the disk array are mapped to blocks in the cache. This mapping is also transparent to the host system. The host system simply requests blocks of data to be read or written and the RAID controller manipulates the disk array and cache memory as required.

To further improve reliability, it is known in the art to provide redundant control modules to reduce the failure rate of the subsystem due to control electronics failures. In some redundant architectures, pairs of control modules are configured such that they control the same physical array of disk drives. A cache memory module is associated with each of the redundant pair of control modules. The redundant control modules communicate with one another to assure that the cache modules are synchronized. In prior designs, the redundant pair of control modules would communicate at their power-on initialization (or after a reset operation). While the redundant control modules completed their communications to assure synchronization of the cache modules, the RAID storage subsystem would be unavailable with respect to completing host computer requests. If the cache modules were found to be "out of sync" the time required to restore synchronization could be significant. In addition, a failure of one of the redundant pair of control modules would further extend the time during which the RAID storage subsystem would be unavailable. Manual (operator) intervention could be required to replace a defective redundant control module in order for the RAID subsystem to begin processing of host computer requests.

In view of the above it is clear that a need exists for an improved cache architecture and control method for RAID subsystems which further reduces the overhead processing required of the RAID subsystem to post cached writes to the disk devices.

SUMMARY OF THE INVENTION

The present invention solves the above and other problems, and thereby advances the useful arts, by providing methods and associated apparatus which permit a RAID storage subsystem having redundant pairs of control modules to assure the consistency of redundant caches while processing host computer I/O requests. In particular, the methods and apparatus of the present invention provides for "check-in" of a first of the two redundant control modules followed by the "check-in" of the second redundant control module. The check-in processing of the methods of the present invention assure that the redundant cache modules are synchronized before the controller pair begins mirrored operations. However, unlike prior designs, the methods of the present invention also permit the first controller to process host computer I/0 requests before the second controller successfully checks in. The methods of the present invention then coordinates the "late check-in" of the second controller by assuring consistency of the redundant caches during processing of host computer I/O request by the first controller.

In particular, the present invention performs required processing at the start of day power on reset cycle (or any other similar reset function) to "check-in" the first of the two redundant control modules. The "check-in" process inspects the cache module of the control module to determine whether its contents are synchronized with the RAID storage subsystem. First, the check-in process determines whether mirrored operation is desired (as indicated by the present configuration of the RAID subsystem). If mirrored operation is not presently required, no further processing is required to synchronize with the second controller—the first controller may function independently without regard for synchronizing its cache memory with the second controller. Assuming mirrored operation is presently desired, the first controller signals to the second controller that it is awaiting its check-in processing.

Responsive to this signal from the first controller, the second controller then checks in by checking its cache module for consistency. Cache module consistency (in either the first or second control module) is determined by verifying that the control module was last used in the present RAID subsystem and that the battery subsystem which maintains the non-volatility of the cache memory has remained properly operational. A control module which was last used in the present RAID subsystem is referred to herein as a "native" module while a control module which was not last used in the present RAID subsystem is referred to herein as a "foreign" control module. If the battery subsystem associated with the cache memory of a control module is properly operational, then the cache memory is assured to have the same contents as when it was last operated in a RAID subsystem. If both control modules are checked in and indicate that they are both native and that both battery subsystems are properly operational, then the redundant control module pair may continue mirrored cache operations. If one of the control modules indicates a foreign status or indicates an invalid cache due to a "bad" battery subsystem, then the first control module continues to perform host computer I/O requests in a "write-through" mode until the two cache memory modules are again restored to synchronization. The caches are synchronized by appropriate copy operations in the background as host computer I/O requests are processed by the first controller in the write-through mode. If neither cache is valid (e.g. both controllers have invalid cache contents because of their foreign status or inoperative battery subsystems), then the caches for both control modules are purged (contents discarded) and mirrored operation continues by starting with empty caches in the redundant control module pair.

Once the first controller is checked and ready for operation, it waits only a brief period for the second controller to check-in and verify cache synchronization. After the brief timeout, the first controller will switch to a "write-through" mode of operation as it awaits the "late check-in" of the second controller. This feature of the present invention enables the RAID subsystem to process host computer I/O requests (though in a degraded mode of operation) while the redundant pair of control modules synchronize their respective caches.

It is therefore an object of the present invention to provide methods and associated apparatus for assuring the consistency of cache memories in a redundant pair of disk array controllers.

It is a further object of the present invention to provide methods and associated apparatus for assuring the consistency of cache memories in a redundant pair of disk array controllers in parallel with processing of host computer I/O requests.

It is a further object of the present invention to provide methods and associated apparatus for synchronizing redundant pairs of cached control modules while a first control module of each pair continues to process host computer I/O requests.

The above and other objects, aspects, features, and advantages of the present invention will become apparent from the following description and the attached drawing.

BRIEF DESCRIPTION OF THE DRAWING

FIGS. 4 and 5 are flowcharts describing the operation of the first of a pair of RDACs checking in; and FIG. 6 is a flowchart describing the operation of the second of a pair of RDACs checking in.

DETAILED DESCRIPTION OF THE PREFERRED EMBODIMENT

While the invention is susceptible to various modifications and alternative forms, a specific embodiment thereof has been shown by way of example in the drawings and will herein be described in detail. It should be understood, however, that it is not intended to limit the invention to the particular form disclosed, but on the contrary, the invention is to cover all modifications, equivalents, and alternatives falling within the spirit and scope of the invention as defined by the appended claims.

RAID OVERVIEW

Figure 1:
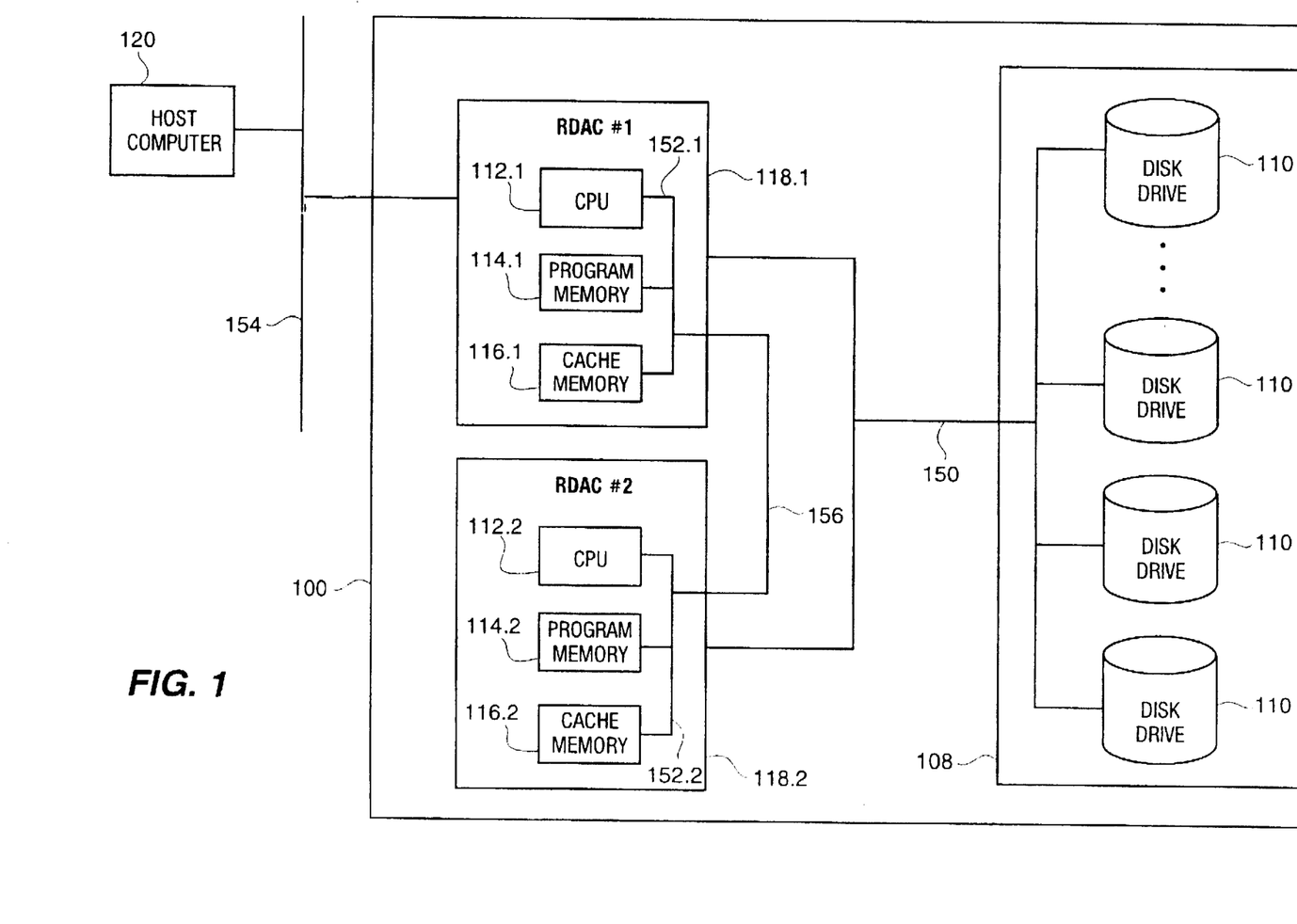
FIG. 1 is a block diagram of a typical RAID storage subsystem in which the structures and methods of the present invention may be applied.

FIG. 1 is a block diagram of a typical RAID storage subsystem 100, having redundant disk array controllers 118.1 and 118.2 (hereinafter referred to as RDACs), in which the methods and associated apparatus of the present invention may be applied. RAID storage subsystem 100 includes at least one pair of RDACs 118.1 and 118.2. Each RDAC 118.1 and 118.2 is in turn connected to disk array 108 via a bus (or busses) 150 and to host computer 120 via bus 154. Disk array 108 is comprised of a plurality of disk drives 110. One of ordinary skill in the art will readily recognize that interface bus 150 between RDACs 118.1 and 118.2 and disk array 108 (including disk drives 110) may be any of several industry standard interface busses including SCSI, IDE, EIDE, IPI, Fiber Channel, SSA, PCI, etc. Circuits (not shown) within RDACs 118.1 and 118.2 appropriate to controlling bus 150 are well known to those of ordinary skill in the art. Interface bus 154 between RDACs 118.1 and 118.2 and host computer 120 may be any of several standard industry interface busses including SCSI, Ethernet (LAN), Token Ring (LAN), etc. Circuits (not shown) within RDACs 118.1 and 118.2 appropriate to controlling bus 154 are well known to those of ordinary skill in the art.

As shown in FIG. 1, RAID storage subsystem 100 may be utilized to implement any of the well known RAID levels (e.g. levels 0–5). The various RAID levels are distinguished by the manner in which the associated RAID controller logically subdivides or partitions the disk drives 110 in disk array 108. For example, when implementing RAID level 1 features, approximately half of the disk drives 110 of disk array 108 are used to store and retrieve data while the other half is operated by the RAID controller to mirror the data storage contents of the first half. Further, when implementing RAID level 4 features, the RAID controller utilizes a portion of the disk drives 110 in disk array 108 for the storage of data and the remaining disk drives 110 are utilized for the storage of error checking/correcting information (e.g. parity information). As discussed below, the methods and associated apparatus of the present invention may be applied to the RAID storage subsystem 100 in conjunction with any of the standard RAID levels.

RDAC 118.1 includes CPU 112.1, program memory 114.1 (e.g. ROM/RAM devices for storing program instructions and variables for the operation of CPU 112.1), and cache memory 116.1 for storing data and control information related to the data stored in disk array 108. CPU 112.1, program memory 114.1, and cache memory 116.1 are connected via memory bus 152.1 to enable CPU 112.1 to store and retrieve information in the memory devices. The data structures of the present invention are embodied within cache memory 116.1 and are created and manipulated by methods operable within CPU 112.1. RDAC 118.2 is identical to RDAC 118.1 and is comprised of CPU 112.2, program memory 114.2 and cache memory 116.2, all interconnected via memory bus 152.2. To permit each RDAC to communicate with the other, the RDACs 118.1 and 118.2 are interconnected via shared bus 156. The RDACs 118.1 and 118.2 are interchangeable devices within RAID subsystem 100 to permit easy replacement, including hot swap, of a defective RDAC. One of ordinary skill in the art will readily recognize that the block diagram of FIG. 1 is intended only as an exemplary design which may embody the present invention. Many alternate controller and subsystem designs may embody the methods and associated apparatus and structures of the present invention.

REDUNDANT CACHE ARCHITECTURE

Figure 2:
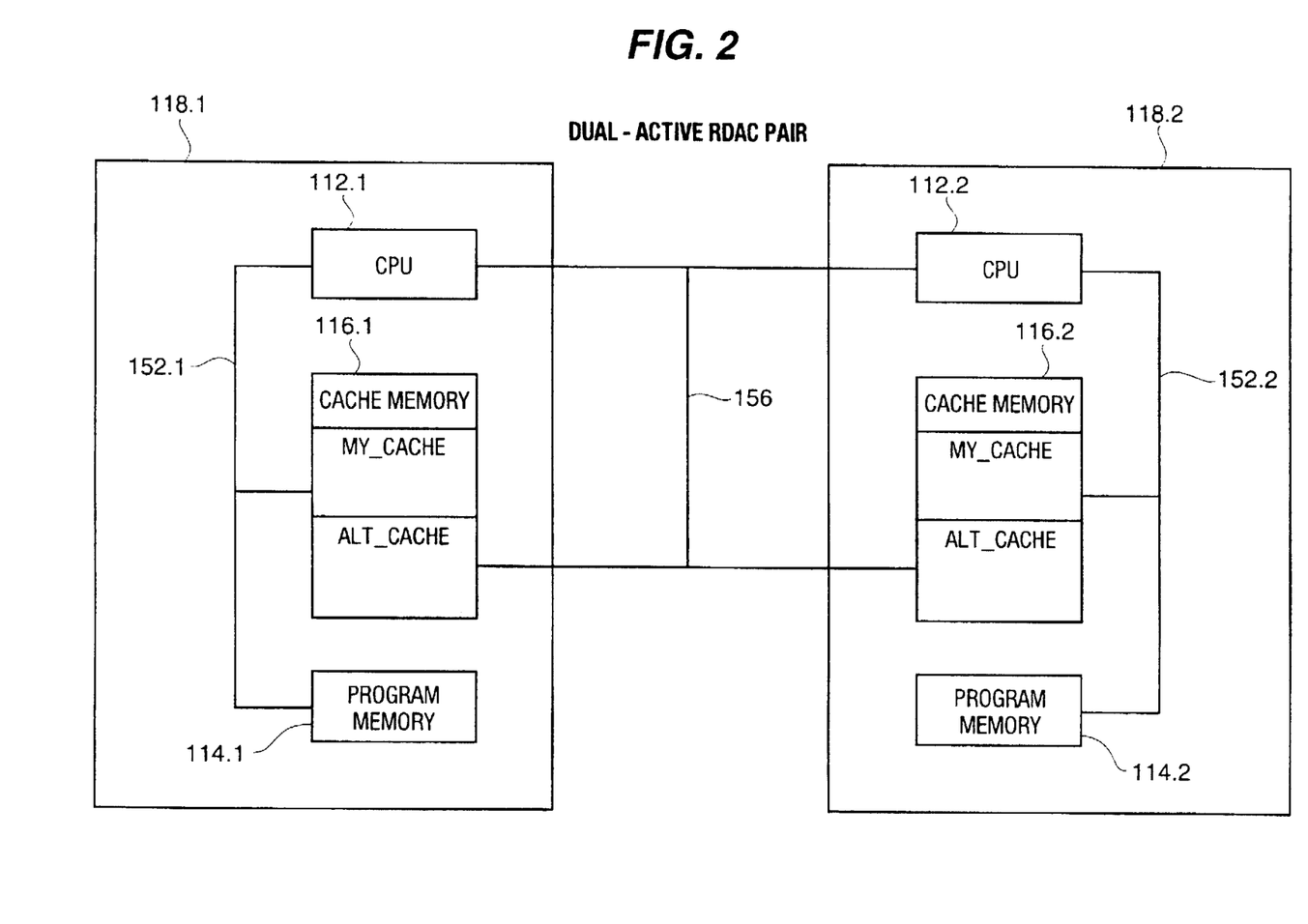
FIG. 2 is a block diagram depicting the RDACs of FIG. 1 configured for dual active operation mode.

Each CPU 112.1 or 112.2 within each RDAC 118.1 or 118.2 can manipulate the cache memory 116.1 or 116.2 of the other RDAC via shared bus 156. The RDACs may be utilized in several modes depending upon software and control methods operable within CPU 112.1 and 112.2. In the dual-active RDAC pair mode of operation, each cache memory 116.1 and 116.2 is logically subdivided by control methods operable within the CPUs 112.1 and 112.2 into a first section for use by the corresponding CPU (attached through their respective memory bus 152.1 and 152.2) and a second section for use by the alternate RDAC (via shared bus 156). As shown in FIG. 2, cache memory 116.1 of RDAC 118.1 has a first section labeled "MY_CACHE" which is used by CPU 112.1 via bus 152.1 to buffer I/O requests to or from the disk drives. A second section of cache memory 116.1, labeled "ALT_CACHE" is reserved for use by the alternate RDAC module, namely 118.2 via shared bus 156. Similarly, cache memory 116.2 in RDAC 118.2 is logically subdivided into a first section "MY_CACHE" for use by CPU 112.2 via bus 152.2 and a second section "ALT_CACHE" for manipulation by the alternate RDAC 118.1 via shared bus 156.

In the dual-active RDAC pair mode, each of the pair of RDACs 118.1 and 118.2 is active in parallel with the other to maintain cache information in its own cache as well as the cache of the alternate RDAC. Each RDAC may control its own particular logical units (disk drive groups within disk array 108 also referred to herein as LUN or LUNs). Specifically, RDAC 118.1 maintains cache information related to management of its logical units in the first section, MY_CACHE, of cache memory 116.1 and in the second section, ALT_CACHE, of cache memory 116.2. Conversely, RDAC 118.2 maintains cache information related to management of its logical units in the first section, MY_CACHE, of cache memory 116.2 and in the second section, ALT_CACHE, of cache memory 116.1. In this mode, each RDAC of the pair has a complete snapshot of the present cache information as maintained by itself and its paired RDAC—the alternate RDAC. When an RDAC is initialized, one RDAC with an invalid cache memory content may update its cache memory (its own MY—CACHE section) from the alternate RDAC's cache memory (the alternate's ALT_CACHE section). Similarly, the alternate RDAC (with a valid cache memory content), may update the ALT_CACHE section of the invalid cache memory by copying its valid cache memory (its MY_CACHE section) to the invalid ALT_CACHE section. The methods of the present invention, discussed in detail below, sequence and manage this cache update procedure to assure synchronization of the RDAC pair cache memories.

Figure 3:
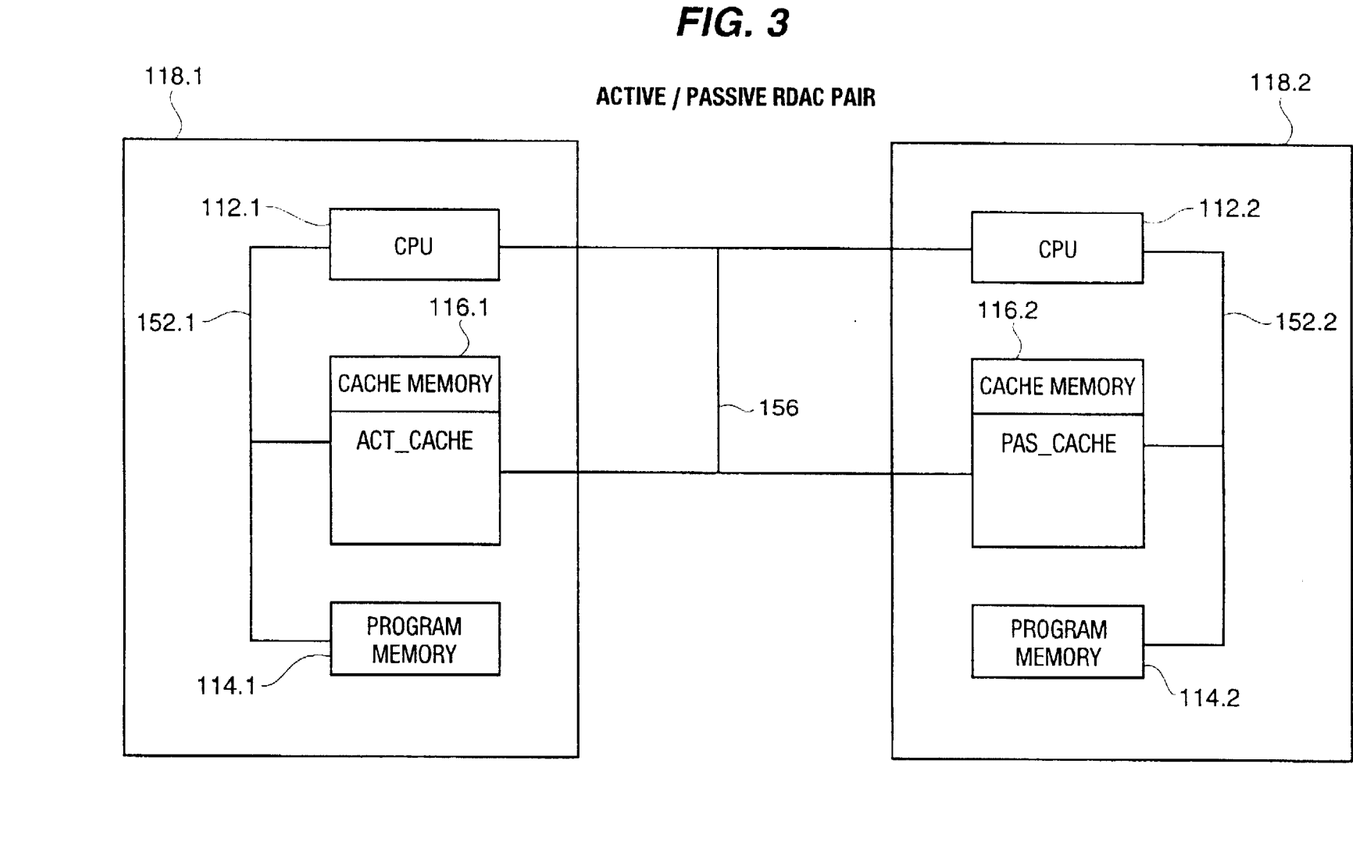
FIG. 3 is a block diagram depicting the RDACs of FIG. 1 configured for active/passive paired operation mode.

In the active-passive RDAC pair mode of operation, one of either RDAC 118.1 or 118.2 is deemed to be "active" such that it processes host computer I/O requests to maintain its cache memory while the other RDAC is "passive" in that it simply maintains a copy in its cache memory of the cache memory in the active RDAC. The passive RDAC does not process host computer I/O requests. Rather, the active RDAC processes host computer I/O requests, updates its own cache memory accordingly, and maintains a mirror image of its cache memory in the cache memory of the alternate RDAC. As shown in FIG. 3, The active RDAC 118.1 maintains its cache memory 116.1 "ALT_CACHE" by processing host computer I/O requests and updating the cache memory 116.1 accordingly. As CPU 112.1 updates its active cache memory 116.1 via bus 152.1, it also mirrors the cache changes to passive cache memory 116.2 in the passive RDAC 118.2 via shared bus 156.

In the active-passive RDAC pair mode of operation, the cache memories 116.1 and 116.2 associated with the RDACs 118.1 and 118.2 are maintained by the active RDAC. This permits the passive RDAC of the pair to immediately assume control when a failure of the primary RDAC is sensed. Similarly, when an RDAC pair is initialized, the RDACs may synchronize the cache memories of the two RDACs by copying from one to another. For example, if the active RDAC 118.1 cache memory 116.1 is invalid, the valid cache memory 116.2 content of the passive RDAC 118.2 may be copied to the cache memory 116.1 of the active RDAC 118.1. Conversely, if the passive RDAC 118.2 cache memory 116.2 is invalid when the RDAC pair is initialized, the valid cache memory 116.1 content of the active RDAC 118.1 may be copied to the cache memory 116.2 of the passive RDAC 118.2. The methods of the present invention, discussed in detail below, sequence and manage this cache update procedure to assure synchronization of the RDAC pair cache memories.

In all modes of operation of redundant pairs of controllers, cache memories contain signature data which associate the cache memory contents with a particular RAID subsystem. An RDAC having a cache memory the content of which is associated with the RAID subsystem in which it is presently operating, as determined by a match of the signature information, is referred to herein as a "native" controller. Conversely, an RDAC having a cache memory the content of which is not associated with the RAID subsystem in which it is presently operating, as determined by a mismatch of the signature information, is referred to herein as a "foreign" controller.

In addition, as noted above, each RDAC cache memory includes a battery subsystem, or other well known apparatus to maintain the validity (non-volatility) of the associated cache memory through power loss to the RDAC module. The battery subsystem includes a sense capability to indicate that the battery subsystem has failed at some time thus raising question as to the non-volatility of the associated cache memory subsystem. An RDAC whose battery subsystem indicates that the cache memory content has been maintained (by proper operation of the battery) is referred to herein as a "valid" cache (or simply as a "good battery"). Conversely, an RDAC whose battery subsystem indicates that the cache memory content is in doubt due to a malfunctioning battery subsystem is referred to herein as an "invalid" cache (or simply as a "bad battery").

The present invention comprises methods, expressed as state machines operable within each of the pair of RDACs, which assure synchronization of the redundant cache memories while reducing the initialization time during which the RAID subsystem is unavailable for processing of host computer system I/O requests.

SYNCHRONIZATION METHOD STATE MACHINE—FIRST CONTROLLER

Figure 4:
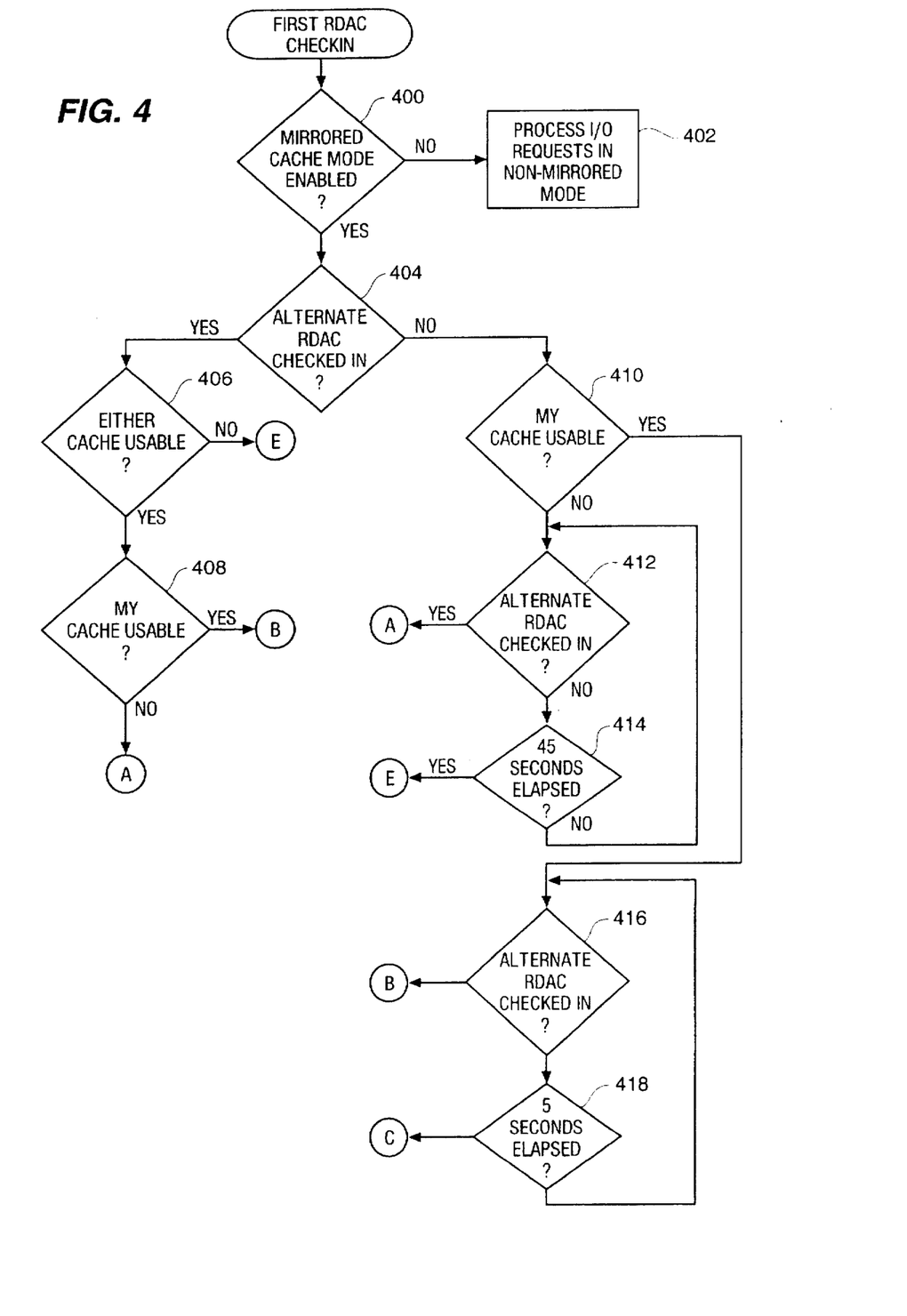
Figure 5:
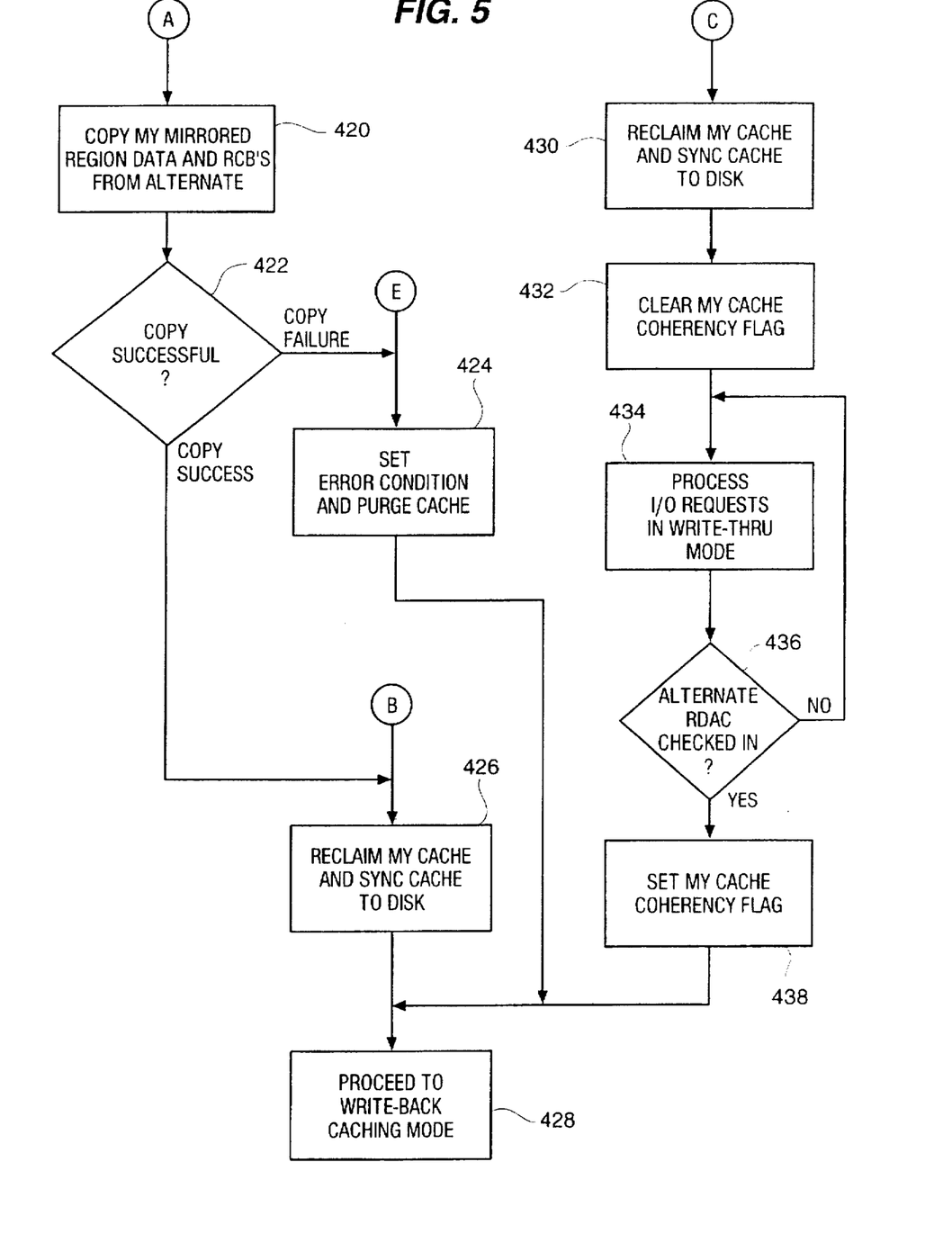

FIGS. 4 and 5 are flowcharts describing the method of the present invention operable within the first of the pair of RDACs to perform its startup initialization. The flowchart describes the operation of a method operable within the CPU 112.1 and 112.2 of the associated RDAC 118.1 and 1 18.2. The first RDAC to perform its initialization may be determined by random chance as the first of the pair of controllers to lock a shared resource (i.e. a software implemented semaphore or a shared register or other equivalent electronic circuits). Alternatively, the first of the pair of RDACs may be determined by physical position within the RAID subsystem. For example, the RDAC pairs are typically inserted into a common backplane/bus device within the RAID subsystem. The first of each pair of controllers may then be defined as the RDAC physically in the lowest slot (assuming the slots of the backplane device are identified in some manner) or the slot nearer a defined position (as for example nearer the power source). Such electronic circuit design choices are well known to those of ordinary skill in the electronic circuit design arts. One of ordinary skill in the art will therefore recognize that the processing of FIGS. 4 and 5 performed by the first RDAC to initialize may physically present in both RDACs (118.1 and 118.2). For simplicity of the following description, it will be assumed that RDAC 118.1 is the first controller to perform its startup initialization while RDAC 118.2 is the second.

As shown in FIGS. 4 and 5 and as discussed in detail below, when RDAC 118.1 initializes, the processing begins by "checking-in" to determine whether mirrored cache operation is enabled by the storage subsystem configuration. If the first RDAC 118.1 determines that the RAID subsystem is not configured for mirrored cache operations, then RDAC 118.1 continues operation in a non-mirrored cache mode. The non-mirrored operation is not of further interest with respect to the present invention but rather is noted for completeness of the model.

If mirrored operation is enabled, then the caches 116.1 and 116.2 of the RDACs 118.1 and 118.2 must be synchronized before mirrored operation can begin. The mirrored caches are not synchronized, as used herein, if either one of the two caches 116.1 and 116.2 indicates a foreign status or if either one of the two RDACs 118.1 and 118.2 indicates a bad battery (invalid cache content). An RDAC which has a native status and a good battery status is referred to herein as usable. Otherwise, an RDAC with either a bad battery status or a foreign status is referred to herein as unusable. If only one of the two mirrored caches is usable, then the other cache may be updated from the usable cache to synchronize the mirrored caches. If both RDACs 118.1 and 118.2 are unusable, then the mirrored caches 116.1 and 116.2 cannot be synchronized using existing data in either of the RDACs 118.1 or 118.2. Rather, the cache memories are synchronized by clearing both caches 116.1 and 116.2 and restarting mirrored cache operations with newly initialized cache contents. When both cache memories 116.1 and 116.2 are purged and caching is restarted, and when both cache memories have good batteries, then the caches are said to be synchronized and both become native to the present RAID subsystem. Similarly, if both cache memories are usable (e.g., have good batteries and both cache memories are native to the present RAID subsystem), then the cache memories are said to be synchronized. In all other conditions, one of the two cache memories 116.1 and 116.2 is used by one of the RDACs 118.1 and 118.2 to copy the contents of the valid, native cache memory to the invalid or foreign cache memory. The process of copying (and associated update of management data structures and flags) serves to synchronize the two cache memories and makes them both native to the present RAID subsystem.

It is common in cache controllers for larger storage subsystems to utilize two levels of cache memory, a non-volatile memory for access to a limited amount of data and a volatile memory for access to larger volumes of data. For example, certain larger data structures for controlling the use of the combined cache memory may be utilized to provide rapid access to the data. Although such cache control blocks (CCBs) may be larger, they provide rapid access to the data stored in the cache memory subsystem. The actual cached data and smaller control blocks are stored in the non-volatile portion of the cache memory subsystem. These recovery control blocks (RCBs) are used to recover (i.e., rebuild) the CCBs in the volatile portion of the cache memory subsystem. When one RDAC copies the cache content of the alternate RDAC, only portions of the non-volatile cache memory in the alternate RDAC need be copied. The volatile portions (CCBs) are rebuilt by reference to the copied RCBs and actual cache data.

Element 400 of FIG. 4 is first operable within the first RDAC 118.1 to determine whether mirrored cache mode is enabled. If element 400 determines that mirrored cache mode is not enabled, then element 402 is operable to process I/O requests in the storage subsystem in non-mirrored mode. This mode is of no further interest to the present invention and therefore is not discussed further. If element 400 determines that mirrored cache mode operation is desired, then processing continues with element 404 to determine the status the alternate RDAC (the second RDAC 118.2).

If element 404 determines that the alternate RDAC 118.2 has checked in (i.e., is ready for further processing to synchronize operation with the first RDAC 118.1), then processing continues with element 406. Element 406 is operable to determine whether either RDAC (118.1 or 118.2) is usable (i.e., has a native status and a good battery status). If neither RDAC is usable, processing continues at label "E" on FIG. 5 to complete processing and enter mirrored mode by purging the cache memory subsystem. Otherwise, element 408 is operable to determine if the first RDAC 118.1 has a usable cache memory subsystem. If (at least) RDAC 118.1 has a usable status, the processing continues at label "B" of FIG. 5 to start mirrored mode operation. Otherwise, processing continues at label "A" of FIG. 5 to copy the cache contents of the usable second RDAC 118.2.

If element 404 of FIG. 4 determines that the alternate RDAC 118.2 has not yet checked in (has not yet sufficiently initialized to begin synchronization with the first RDAC 118.1), then element 410 is next operable to determine whether the first RDAC 118.1 has a usable cache memory subsystem. If the first RDAC has a usable cache memory subsystem, elements 416 and 418 are iteratively operable to wait up to five seconds for the alternate RDAC 118.2 to check in. In particular, element 416 determines whether the alternate RDAC 118.2 has checked in. If so, processing continues at label "B" of FIG. 5. If not, processing continues at with element 418 which tests whether the five second timeout value has expired. If so, processing continues at label "C" of FIG. 5, to begin write-through operation of the first RDAC 118.1 while awaiting late check in of the alternate RDAC. If the five second timeout period has not expired, processing continues by looping back to element 416.

If operation of element 410 above determined that the first RDAC 118.1 does not have a usable cache memory subsystem, processing continues with elements 412 and 414 to await late check in of the alternate RDAC 118.2. In particular, element 412 determines whether the alternate RDAC 118.2 has checked in. If so, processing continues at label "A" of FIG. 5 to complete processing by copying one cache memory content to the other. If the alternate RDAC 118.2 has not checked in, processing continues with element 414 to determine if the long timeout period (forty five seconds) has elapsed. Since the first RDAC 118.1 has an unusable cache in its present state, the wait for check in of the alternate RDAC is extended beyond the brief five second wait discussed above with respect to elements 416 and 418. If the extended timeout period has expired, processing continues at label "E" of FIG. 5. Otherwise, processing continues by looping back to element 412.

One of ordinary skill in the art will readily recognize that any timeout period value may be applied in the processing of elements 412–418. The timeouts are intended to be relatively short so as to permit the first RDAC to start write-through operations as soon as possible. The storage subsystem is made operable by processing of the first RDAC 118.1 in the write-through mode. The short timeout period described above in elements 416–418 (preferably about five seconds) allows the storage subsystem to become operable as soon as possible with only one of the RDAC pair fully operable. The extended time described above with respect to elements 412–414 (preferably forty five seconds) allows the second RDAC additional time to, for example, overcome any delays which may be easily repaired by an operator. At such later time as the second RDAC checks in, the redundant pair can begin fully synchronized, mirrored operation.

In the write-through cache mode all write I/O requests are immediately posted to the disk array 108 of the RAID subsystem. No new dirty data (data awaiting deferred posting as generated in the write-back cache mode) will be generated in the cache 116.1 by operation of the RAID controller in write-through mode. Unlike prior designs with dual controllers, the methods and structures of the present invention permit degraded operation in write-through mode while the caches of the dual controllers are synchronized. Conversely, prior designs halted all operation of the RAID subsystem to await initialization/synchronization of the redundant controller caches. Though performance of the RAID subsystem is degraded in the write-through mode of cache operation this degraded performance is preferable to non-operability in many RAID applications.

Referring now to FIG. 5, the flow chart of FIG. 4 continues at label "A" with operation of element 420 in response to a determination that the alternate RDAC 118.2 is usable with respect to its cache memory content and the first RDAC 118.1 is not usable. The RCBs and cache memory 116.2 content of alternate RDAC 118.2 are copied to the cache memory 116.1 of the first RDAC 118.1. As noted above, only the contents of the non-volatile portion of the cache memory need be copied. The corresponding volatile portion of the cache memory 116.1 content (i.e., the CCBs) can be rebuilt from the copied non-volatile cache data. Element 422 is then operable to determine whether the copy of the alternate cache content was successful. If the copy was successful, operation continues at label "B" of FIG. 5 to complete the process of synchronizing the redundant caches. If the copy failed to properly synchronize the cache memory contents, then processing continues at label "E" of FIG. 5. The success or failure of the copy process is determined by the resultant status associated with the physical exchange of information between the cache memories (e.g., the physical status).

The flowchart of FIG. 4 continues at label "B" on FIG. 5 with processing to complete the process of synchronizing the redundant caches. Element 426 is then operable to reclaim all cache data structures and resources by flushing all dirty data from the synchronized caches to the disk array. Processing then continues with element 428 to proceed to mirrored, write-back cache mode with the RDAC pair fully synchronized for mirrored mode operation.

The flowchart of FIG. 4 continues at label "C" of FIG. 5 with processing to enter the write-through mode of operation by the first RDAC 118.1 while awaiting the belated check in of the alternate RDAC 118.2. Element 430 is operable to reclaim all cache data structures and resources by flushing all dirty data from the cache memory 116.1 of the first RDAC 118.1 to the disk array. Processing then continues with element 432 to clear the cache coherency flag for the first RDAC 118.1. Clearing the flag indicates to the alternate RDAC 118.2 that the first RDAC 118.1 is operating in write-through mode while awaiting the belated check in of the alternate RDAC 118.2. The coherency flag is used as discussed below to assure proper recovery if the first RDAC 118.1 fails while operating in write-through mode and the second RDAC 118.2 eventually initializes to a point where it is ready to take over on behalf of the failed RDAC 118.1. Once the coherency flag is cleared, processing continues with elements 434 and 436 to process I/O requests in the write-through mode while awaiting late check in of the alternate RDAC 118.2. In particular, element 434 processes any outstanding write requests and posts them directly to the disk array writing through the cache 116.1. Element 436 then tests whether the alternate RDAC 118.2 has finally checked in. If not, processing continues by looping back to element 434. If so, processing continues at element 438 to set the coherency flag of the first RDAC 118.1 and then continue processing at element 428 to proceed to mirrored, write-back cache mode with the RDAC pair fully synchronized for mirrored mode operation.

The flow chart of FIG. 4 continues at label "E" of FIG. 5 to generate an error condition (for eventual reporting to an attached computer system) and to then purge the cache memory 116.1 content. If neither RDAC is usable for purposes of synchronizing the other, then both RDACs purge their cache memories (and await proper charging of the battery systems to maintain their non-volatile memory) and continue operation in mirrored mode. The pair of cache memories is synchronized by the purging of both cache memories.

SYNCHRONIZATION METHOD STATE MACHINE— SECOND CONTROLLER

Figure 6:
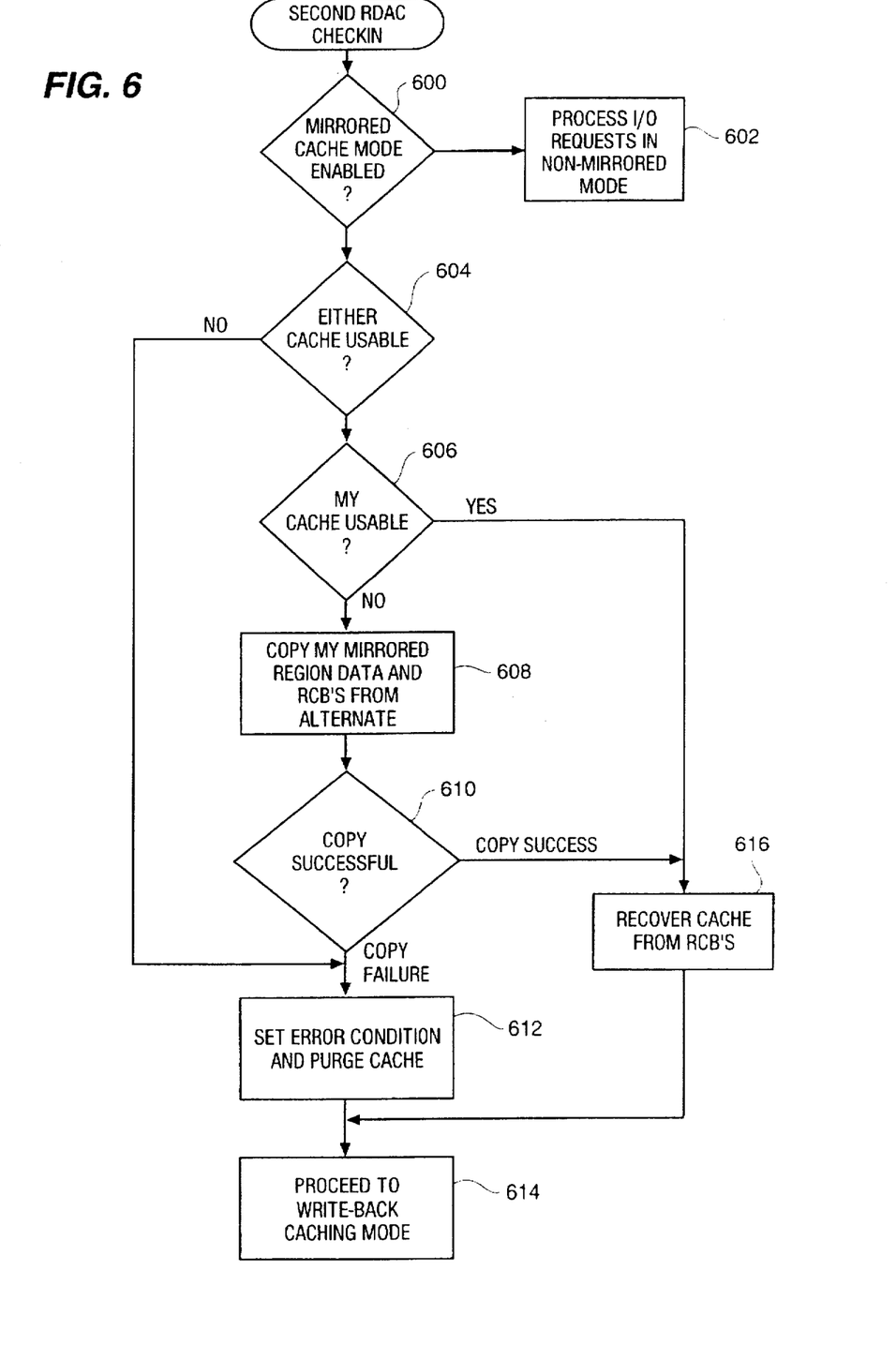

FIG. 6 is flowchart of the methods of the present invention operable within the second RDAC 118.2 in performing its startup initialization. The second RDAC 118.2 is also referred to above as the alternate RDAC in the context of discussing operation of the first RDAC 118.1. As noted above, the term "alternate RDAC" as used herein is relative to the particular RDAC of the redundant pair being discussed. With reference to FIG. 6 which describes the methods of the present invention operable within the second RDAC 118.2, the "alternate" RDAC is the first RDAC 118.1.

As shown in FIG. 6, element 600 is first operable to determine whether the storage subsystem is configured to enable mirrored mode operations. If mirrored operation is not enabled, processing continues with element 602 to process all I/O requests in non-mirrored mode. Non-mirrored mode operation is not of interest with respect to the present invention and therefore need not be discussed further. If mirrored operation is enabled, processing continues with element 604 to determine whether either RDAC is usable with respect to its cache memory content. As noted above, an RDAC is usable if its cache memory has been maintained in a non-volatile state by a good battery subsystem and the RDAC is identified as native with respect to the storage subsystem in which it is presently operating. If neither RDAC is usable for copying of its cache memory content to the other, then processing continues at element 612. Otherwise, if at least one of the two RDACs is usable with respect to its cache memory content, then processing continues with element 606.

Element 606 is operable to determine if at least the second RDAC's cache memory is usable. If the second RDAC is not usable, processing continues with element 608 to copy the content of the alternate (first) RDAC 118.1 into the cache memory 116.2 of the second RDAC 118.2. As noted above, only the portions of the cache memory which are stored in the non-volatile portion of the cache memory need be copied. Other data structures relating to management of the cache memory which are stored in a volatile portion of the memory may be rebuilt from the information copied into the non-volatile portion. Element 610 is then operable to determine whether the cache copy operation was successful. The success or failure of the copy process is determined by the resultant status associated with the physical exchange of information between the cache memories (e.g., the physical status). If the copy succeeded in duplicating portions of the cache from the first RDAC 118.1 then processing continues with element 616. If the copy fails, processing continues with element 612 to set an error condition (eventually reported to an attached computer system) and then to synchronize the cache memory 116.2 of the second RDAC 118.2 by purging the contents of the caches. Processing then continues with element 614 to commence write-back mirrored cache operation.

If element 606 determines that the cache 116.2 of the second RDAC 118.2 is usable or if element 610 determines that the copy of the cache from the alternate (first) RDAC 118.1 was successful (thereby synchronizing the redundant caches), then processing continues with element 616 to complete processing to synchronize the duplicate, redundant caches. In particular, element 616 is operable to recovery all volatile cache management data structures (e.g., CCBs) from the non-volatile portion of the cache 116.2 now synchronized with the alternate (first) cache 116.1. Processing then continue with element 614, as above, to commence processing of I/O requests in the write-back mirrored cache mode.

The processing described above with reference to FIGS. 4–6 responsible for synchronizing the dual caches essentially determines which of the two caches 116.1 or 116.2 (if any) is to be copied to the other to synchronize the caches. Alternatively, the processing may determine that neither cache is usable and synchronize the caches by purging the content of both caches. The following Table 1 summarizes the action taken to synchronize the caches under each possible state of the dual RDACs 1 18.1 and 1 18.2.

TABLE 1

Cache Synchronization Actions

| RDAC 1 status | RDAC 1 batt. | RDAC 2 status | RDAC 2 batt. | Action |
|---|---|---|---|---|
| Native | Good | Native | Good | none |
| Native | Good | Native | Bad | 1 -> 2 |
| Native | Good | Foreign | Good | 1 -> 2 |
| Native | Good | Foreign | Bad | 1 -> 2 |
| Native | Bad | Native | Good | 2 -> 1 |
| Native | Bad | Native | Bad | Purge |
| Native | Bad | Foreign | Good | Purge |
| Native | Bad | Foreign | Bad | Purge |
| Foreign | Good | Native | Good | 2 -> 1 |
| Foreign | Good | Native | Bad | Purge |
| Foreign | Good | Foreign | Good | Purge |
| Foreign | Good | Foreign | Bad | Purge |
| Foreign | Bad | Native | Good | 2 -> 1 |
| Foreign | Bad | Native | Bad | Purge |
| Foreign | Bad | Foreign | Good | Purge |
| Foreign | Bad | Foreign | Bad | Purge |

In the above Table 1, action "1→2" indicates a copy of first RDAC cache 116.1 to second RDAC cache 116.2, "2→1" indicates a copy of second RDAC cache 116.2 to first RDAC cache 116.1, and "Purge" indicates a purge of both caches 116.1 and 116.2. Following the synchronization of the caches 116.1 and 116.2 and the charging of both battery subsystems to reset the "bad" indication, the status of both RDACs 118.1 and 118.2 is changed to "Native."

CACHE COHERENCY FLAG—FAILED RDAC TAKEOVER

A cache coherency flag is associated with each of the pair of RDACs. The cache coherency flag, if cleared, indicates that the corresponding RDAC 118.1 was operating in the write-through mode and that its cache had therefore been flushed to the disk. This aspect of operation of RDAC 118.1 is discussed above with respect to elements 430–438 of FIG. 5. If the cache coherency flag is set, the corresponding RDAC 118.1 was not operating at the time in the write-through mode. The cache memory 116.1 of the RDAC 118.1 operating in write-through mode is purged (flushed to disk). When not operating in write-through mode, the cache memory 116.1 of the RDAC 118.1 may contain data not yet posted to disk (dirty data).

If the RDAC 118.1 is operating in write-through mode (awaiting the belated check in of the alternate RDAC 118.2) and fails while operating in write-through mode, the disk array is known to be in a consistent state because all disk operations were written through the cache 116.1 directly to the disk array. Eventually the alternate RDAC 118.2 may complete its check in processing and seek to determine the state of the first RDAC 118.1. The alternate control 118.2 in such circumstances can detect from the cleared coherency flag of the failed RDAC 118.1 that the disk array is in a consistent state. The alternate RDAC 118.2 then clears its cache memory 116.2 and begins its processing in write-through mode. This aspect of the present invention assures integrity of the data storage and cache memories even in case of a total failure of one RDAC of the pair while permitting continued operation.

While the invention has been illustrated and described in detail in the drawings and foregoing description, such illustration and description is to be considered as exemplary and not restrictive in character, it being understood that only the preferred embodiment and minor variants thereof have been shown and described and that all changes and modifications that come within the spirit of the invention are desired to be protected.

What is claimed is:

1. In a RAID storage subsystem having redundant disk array controllers each with a cache memory, a method for maintaining cache memory mirrored consistency between said redundant disk array controllers comprising the steps of:

determining whether the cache memories in each of said redundant disk array controllers are synchronized;

operating at least one of said redundant disk array controllers in a cache memory write-through mode in response to a determination that said cache memories are not synchronized; and operating both of said redundant disk array controllers in a cache memory write-back mirrored mode in response to a determination that said cache memories are synchronized.

2. The method of claim 1 further comprising the step of:

synchronizing said cache memories, responsive to the determination that said cache memories are not synchronized, by copying one of said cache memories to the other of said cache memories.

3. The method of claim 1 wherein each of said cache memories has a validity boolean attribute indicating, if having a value of true, that the associated cache memory has remained non-volatile and wherein the determining step includes:

determining that said cache memories are synchronized if both cache memories have a validity boolean attribute value of true; and determining that said cache memories are not synchronized if at least one of said cache memories has a validity boolean attribute value of false.

4. The method of claim 3 further comprising the step of synchronizing the cache memories, responsive to the determination that said cache memories are not synchronized, wherein said synchronizing step includes the steps of:

determining that both cache memories have a validity boolean attribute value of false;

purging the contents of both cache memories responsive to the determination that both cache memories have a validity boolean attribute value of false;

determining that one of said cache memories has a validity boolean attribute value of true;

copying the contents of said one of said cache memories having a validity boolean attribute value of true to others of said cache memories; and setting said validity boolean attribute values of each of said cache memories to true.

5. The method of claim 1 wherein each of said cache memories has a native boolean attribute indicating, if having a value of true, that the contents stored in the cache memory was last associated with the RAID storage subsystem and wherein the determining step includes:

determining that said cache memories are synchronized if both cache memories have a native boolean attribute value of true; and determining that said cache memories are not synchronized if at least one of said cache memories has a native boolean attribute value of false.

6. The method of claim 5 further comprising the step of synchronizing the cache memories, responsive to the determination that said cache memories are not synchronized, wherein said synchronizing step includes the steps of:

determining that both cache memories have a native boolean attribute value of false;

purging the contents of both cache memories responsive to the determination that both cache memories have a native boolean attribute value of false;

determining that one of said cache memories has a native boolean attribute value of true;

copying the contents of said one of said cache memories having a native boolean attribute value of true to others of said cache memories; and setting said native boolean attribute values of each of said cache memories to true.

7. The method of claim 1 wherein each of said cache memories has a validity boolean attribute indicating, if having a value of true, that the associated cache memory has remained non-volatile and wherein each of said cache memories has a native boolean attribute indicating, if having a value of true, that the contents stored in the cache memory was last associated with the RAID storage subsystem and wherein the determining step includes:

determining that said cache memories are synchronized if both cache memories have a native boolean attribute value of true and if both cache memories have a valid boolean attribute value of true; and determining that said cache memories are not synchronized if at least one of said cache memories has a native boolean attribute value of false or if at least one of said cache memories has a valid boolean attribute value of false.

8. The method of claim 7 further comprising the step of synchronizing the cache memories, responsive to the determination that said cache memories are not synchronized, wherein said synchronizing step includes the steps of:

determining that none of said cache memories has a native boolean attribute value of true and has a validity boolean attribute value of true;

purging the contents of both cache memories responsive to the determination that none of said cache memories has a native boolean attribute value of true and has a validity boolean attribute value of true;

determining that one of said cache memories has a native boolean attribute value of true and has a validity boolean attribute value of true;

copying the contents of said one of said cache memories having a native boolean attribute value of true and having a validity boolean attribute value of true to others of said cache memories;

setting said native boolean attribute values of each of said cache memories to true; and setting said validity boolean attribute values of each of said cache memories to true.

9. In a RAID storage subsystem having redundant disk array controllers each with a cache memory, apparatus operable within said redundant disk array controllers for maintaining cache memory mirrored consistency between said redundant disk array controllers, said apparatus comprising:

means for determining whether the cache memories in each of said redundant disk array controllers are synchronized;

means for operating at least one of said redundant disk array controllers in a cache memory write-through mode in response to a determination that said cache memories are not synchronized; and means for operating both of said redundant disk array controllers in a cache memory write-back mirrored mode in response to a determination that said cache memories are synchronized.

10. The apparatus of claim 9 further comprising:

means for synchronizing said cache memories, responsive to the determination that said cache memories are not synchronized, by copying one of said cache memories to the other of said cache memories.

11. The apparatus of claim 9 wherein each of said cache memories has a validity boolean attribute indicating, if having a value of true, that the associated cache memory has remained non-volatile and wherein the means for determining includes:

means for determining that said cache memories are synchronized if both cache memories have a validity boolean attribute value of true; and means for determining that said cache memories are not synchronized if at least one of said cache memories has a validity boolean attribute value of false.

12. The apparatus of claim 11 further comprising means for synchronizing the cache memories, responsive to the determination that said cache memories are not synchronized, wherein said means for synchronizing includes:

means for determining that both cache memories have a validity boolean attribute value of false;

means for purging the contents of both cache memories responsive to the determination that both cache memories have a validity boolean attribute value of false;

means for determining that one of said cache memories has a validity boolean attribute value of true;

means for copying the contents of said one of said cache memories having a validity boolean attribute value of true to others of said cache memories; and means for setting said validity boolean attribute values of each of said cache memories to true.

13. The apparatus of claim 9 wherein each of said cache memories has a native boolean attribute indicating, if having a value of true, that the contents stored in the cache memory was last associated with the RAID storage subsystem and wherein the means for determining includes:

means for determining that said cache memories are synchronized if both cache memories have a native boolean attribute value of true; and means for determining that said cache memories are not synchronized if at least one of said cache memories has a native boolean attribute value of false.

14. The apparatus of claim 13 further comprising means for synchronizing the cache memories, responsive to the determination that said cache memories are not synchronized, wherein said means for synchronizing includes:

means for determining that both cache memories have a native boolean attribute value of false;

means for purging the contents of both cache memories responsive to the determination that both cache memories have a native boolean attribute value of false;

means for determining that one of said cache memories has a native boolean attribute value of true;

means for copying the contents of said one of said cache memories having a native boolean attribute value of true to others of said cache memories; and means for setting said native boolean attribute values of each of said cache memories to true.

15. The apparatus of claim 9 wherein each of said cache memories has a validity boolean attribute indicating, if having a value of true, that the associated cache memory has remained non-volatile and wherein each of said cache memories has a native boolean attribute indicating, if having a value of true, that the contents stored in the cache memory was last associated with the RAID storage subsystem and wherein the means for determining includes:

means for determining that said cache memories are synchronized if both cache memories have a native boolean attribute value of true and if both cache memories have a valid boolean attribute value of true; and means for determining that said cache memories are not synchronized if at least one of said cache memories has a native boolean attribute value of false or if at least one of said cache memories has a valid boolean attribute value of false.

16. The apparatus of claim 15 further comprising means for synchronizing the cache memories, responsive to the determination that said cache memories are not synchronized, wherein said means for synchronizing includes:

means for determining that none of said cache memories has a native boolean attribute value of true and has a validity boolean attribute value of true;

means for purging the contents of both cache memories responsive to the determination that none of said cache memories has a native boolean attribute value of true and has a validity boolean attribute value of true;

means for determining that one of said cache memories has a native boolean attribute value of true and has a validity boolean attribute value of true;

means for copying the contents of said one of said cache memories having a native boolean attribute value of true and having a validity boolean attribute value of true to others of said cache memories;

means for setting said native boolean attribute values of each of said cache memories to true; and means for setting said validity boolean attribute values of each of said cache memories to true.

* * * * *